(12) United States Patent
Hollis

(10) Patent No.: US 8,018,232 B2
(45) Date of Patent: Sep. 13, 2011

(54) INTERLEAVED GRADIENT COIL FOR MAGNETIC RESONANCE IMAGING

(75) Inventor: Timothy Hollis, Bicester (GB)

(73) Assignee: General Electric Company, Schenectady, NY (US)

( * ) Notice: Subject to any disclaimer, the term of this patent is extended or adjusted under 35 U.S.C. 154(b) by 226 days.

(21) Appl. No.: 12/415,956

(22) Filed: Mar. 31, 2009

(65) Prior Publication Data

US 2010/0244836 A1    Sep. 30, 2010

(51) Int. Cl.
    *G01V 1/00*    (2006.01)
(52) U.S. Cl. ...................................................... 324/318
(58) Field of Classification Search .......... 324/300–322, 324/407–445
    See application file for complete search history.

(56) References Cited

U.S. PATENT DOCUMENTS

| | | | |
|---|---|---|---|
| 4,456,881 A * | 6/1984 | Compton ...................... | 324/319 |
| 5,424,643 A | 6/1995 | Morich | |
| 5,488,299 A | 1/1996 | Kondo | |
| 5,497,089 A * | 3/1996 | Lampman et al. ............ | 324/318 |
| 5,561,371 A | 10/1996 | Schenck | |
| 5,578,925 A * | 11/1996 | Molyneaux et al. .......... | 324/318 |
| 5,655,533 A * | 8/1997 | Petropoulos et al. ......... | 600/422 |
| 5,682,098 A * | 10/1997 | Vij ................ | 324/318 |
| 5,804,968 A | 9/1998 | Richard | |
| 5,998,998 A | 12/1999 | Westphal | |
| 6,054,854 A * | 4/2000 | Kawamoto ..................... | 324/318 |
| 6,525,536 B2 * | 2/2003 | Minas et al. .................. | 324/318 |
| 6,771,072 B2 * | 8/2004 | Schuster et al. .............. | 324/318 |
| 7,061,242 B2 * | 6/2006 | Ochi et al. .................... | 324/318 |
| 7,087,008 B2 * | 8/2006 | Fox et al. ........................ | 600/13 |
| 7,372,275 B2 * | 5/2008 | Feenan .......................... | 324/322 |
| 7,382,131 B2 * | 6/2008 | Eberler et al. ............... | 324/318 |
| 7,576,542 B1 * | 8/2009 | Lvovsky ....................... | 324/318 |
| 2005/0288573 A1 * | 12/2005 | Timmins ....................... | 600/410 |

* cited by examiner

*Primary Examiner* — Brij B Shrivastav
(74) *Attorney, Agent, or Firm* — Fletcher Yoder

(57) ABSTRACT

Gradient coils for generating gradient magnetic fields in a magnetic resonance imaging system are provided. In one embodiment, a gradient coil for a magnetic resonance imaging system may include a plurality of turns formed generally in a figure-eight. The figure-eight may form a first section configured to overly a section of a first adjacent coil, a second section configured to underly another section of the first adjacent coil, a third section configured to overly a section of a second adjacent coil, and a fourth section configured to underly another section of the second adjacent coil.

18 Claims, 5 Drawing Sheets ure eight.

INTERLEAVED GRADIENT COIL FOR MAGNETIC RESONANCE IMAGING

BACKGROUND

The subject matter disclosed herein relates generally to magnetic resonance imaging systems and, more particularly, to gradient coils for use in magnetic resonance imaging systems.

Magnetic resonance imaging (MRI) systems enable imaging based on a primary magnetic field, a radio frequency (RF) pulse, and time-varying magnetic gradient fields that interact with specific nuclear components in an object, such as hydrogen nuclei in water molecules. The magnetic moments of such nuclear components may attempt to align with the primary magnetic field, but subsequently precess at a characteristic frequency known as the Larmor frequency. An RF pulse at or near the Larmor frequency of such nuclear components may cause the magnetic moments to be rotated. When the RF pulse has ended, the magnetic moments may attempt to realign with the primary magnetic field, emitting a detectable signal.

At least three discrete gradient coils (x, y, and z) may produce time-varying magnetic gradient fields ($G_x$, $G_y$, and $G_z$) calculated to enable detection of signals from a specified slice of the object. One problem that may arise is that the gradient fields produced by the respective gradient coils may vary. Such variations may make signal localization more difficult.

BRIEF DESCRIPTION

Embodiments of the presently disclosed subject matter may generally relate to gradient coils in magnetic resonance imaging systems. In one embodiment, a gradient coil for a magnetic resonance imaging system may include a plurality of turns formed generally in a figure-eight.

In another embodiment, a gradient coil for a magnetic resonance imaging system may include four self-similar coils, each coil having a plurality of turns formed generally in a figure-eight. The coils may be interleaved in a generally cylindrical configuration with a first section of each coil overlying a corresponding underlying section of a preceding coil, a second section underlying a corresponding overlying section of the preceding coil, a third section underlying a corresponding overlying section of a subsequent coil, and a fourth section overlying a corresponding underlying section of the subsequent coil.

In a further embodiment, a gradient coil for a magnetic resonance imaging system may include first and second X coils disposed at diametrically opposite locations in a generally cylindrical configuration and first and second Y coils disposed at diametrically opposite locations in the generally cylindrical configuration and displaced at 90 degrees with respect to the X coils. The coils may be interleaved with an overlying section of each X coil overlying a corresponding underlying section of each adjacent Y coil and an underlying section of the same X coil underlying a corresponding overlying section of the same adjacent Y coil.

BRIEF DESCRIPTION OF THE DRAWINGS

These and other features, aspects, and advantages will become better understood when the following detailed description is read with reference to the accompanying drawings in which like characters represent like parts throughout the drawings, wherein.

DETAILED DESCRIPTION

Figure 1:
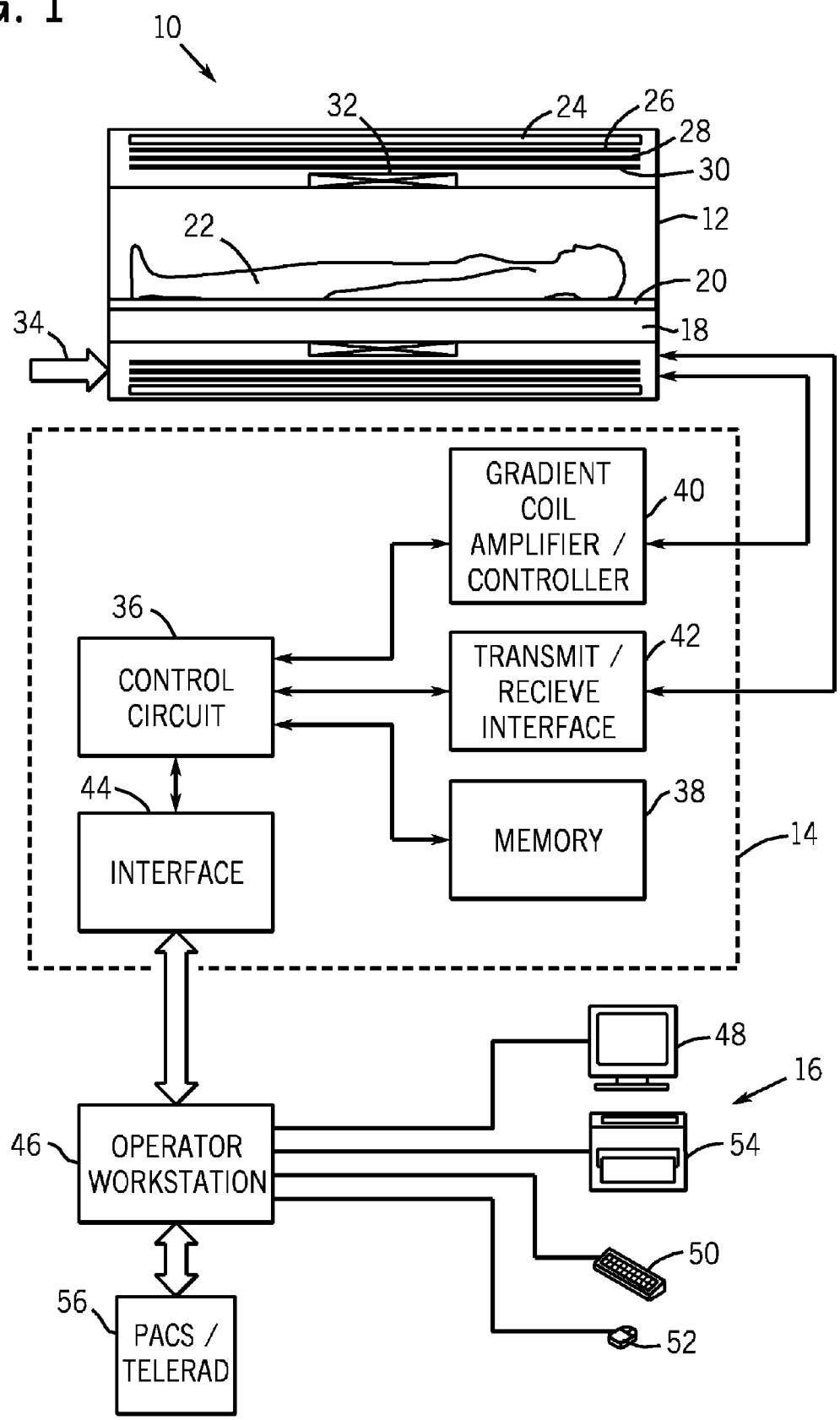
FIG. 1 is a diagrammatical representation of an MRI system that employs interleaved gradient coils in accordance with an aspect of the present invention.

Turning now to the drawings, and referring first to FIG. 1, a magnetic resonance imaging (MRI) system 10 is illustrated diagrammatically as including a scanner 12, scanner control circuitry 14, and system control circuitry 16. While the MRI system 10 may include any suitable MRI scanner or detector, in the illustrated embodiment the system includes a full body scanner comprising an imaging volume 18 into which a table 20 may be positioned to place a patient 22 in a desired position for scanning. The scanner 12 may additionally or alternatively be configured to target certain anatomy, such as the head or neck.

The scanner 12 may include a series of associated coils for producing controlled magnetic fields, for generating radio frequency (RF) excitation pulses, and for detecting emissions from gyromagnetic material within the patient in response to such pulses. In the diagrammatical view of FIG. 1, a main magnet 24 is provided for generating a primary magnetic field generally aligned with the imaging volume 18. A series of gradient coils 26, 28 and 30 are grouped in one or more gradient coil assemblies for generating controlled magnetic gradient fields during examination sequences as described more fully below. An RF coil 32 is provided for generating RF pulses for exciting the gyromagnetic material. Power may be supplied to the scanner 12 in any appropriate manner, as indicated generally at reference numeral 34. In the embodiment illustrated in FIG. 1, the RF coil 32 may also serve as a receiving coil. Thus, the RF coil 32 may be coupled with driving and receiving circuitry in passive and active modes for receiving emissions from the gyromagnetic material and for applying RF excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

In a present configuration, the gradient coils 26, 28, and 30 may be formed of conductive wires, bars or plates which are wound or cut to form a coil structure which generates a gradient field upon application of control pulses. The placement of the coils within the gradient coil assembly may be done in several different orders and with varying configurations, and the scanner 12 may further include complementary gradient coils (in the manner described below) to shield the gradient coils 26, 28, and 30. Generally, a z-gradient coil 26 may be positioned at an outermost location, and is formed generally as a solenoid-like structure which has relatively little impact on the RF magnetic field. The gradient coils 28 and 30 may be x-axis and y-axis coils respectively.

The gradient coils 26, 28, and 30 of the scanner 12 may be controlled by external circuitry to generate desired fields and pulses, and to read signals from the gyromagnetic material in a controlled manner. When the material, typically bound in tissues of the patient, is subjected to the primary field, individual magnetic moments of the paramagnetic nuclei in the tissue partially align with the field. While a net magnetic moment is produced in the direction of the polarizing field, the randomly oriented components of the moment in a perpendicular plane generally cancel one another. During an examination sequence, the RF coil 32 may generate an RF pulse at or near the Larmor frequency of the material of interest, resulting in rotation of the net aligned moment to produce a net transverse magnetic moment. This transverse magnetic moment precesses around the main magnetic field direction, emitting RF signals that are detected by the scanner 12 and processed for reconstruction of the desired image.

The gradient coils 26, 28, and 30 may serve to generate precisely controlled magnetic fields, the strength of which vary over a predefined field of view, typically with positive and negative polarity. When each gradient coil 26, 28, or 30 is energized with known electric current, the resulting magnetic field gradient is superimposed over the primary field and produces a desirably linear variation in the axial component of the magnetic field strength across the field of view. The field may vary linearly in one direction, but may be homogenous in the other two. The three gradient coils 26, 28, and 30 have mutually orthogonal axes for the direction of their variation, enabling a linear field gradient to be imposed in an arbitrary direction with an appropriate combination of the three gradient coils 26, 28, and 30.

The pulsed gradient fields may perform various functions integral to the imaging process. Some of these functions are slice selection, frequency encoding and phase encoding. These functions can be applied along the x-, y- and z-axes of the original coordinate system or along other axes determined by combinations of pulsed currents applied to the individual field coils.

The slice select gradient field may determine a slab of tissue or anatomy to be imaged in the patient, and may be applied simultaneously with a frequency selective RF pulse to excite a known volume of spins that may precess at the same frequency. The slice thickness may be determined by the bandwidth of the RF pulse and the gradient strength across the field of view.

The frequency encoding gradient, also known as the readout gradient, is usually applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position along the gradient field. By Fourier transformation, acquired signals may be analyzed to identify their location in the selected slice by virtue of the frequency encoding.

Finally, the phase encode gradient is generally applied before the readout gradient and after the slice select gradient. Localization of spins in the gyromagnetic material in the phase encode direction is accomplished by sequentially inducing variations in phase of the precessing protons of the material using slightly different gradient amplitudes that are sequentially applied during the data acquisition sequence. The phase encode gradient permits phase differences to be created among the spins of the material in accordance with their position in the phase encode direction.

A great number of variations may be devised for pulse sequences employing the exemplary gradient pulse functions described above, as well as other gradient pulse functions not explicitly described here. Moreover, adaptations in the pulse sequences may be made to appropriately orient the selected slice and the frequency and phase encoding to excite the desired material and to acquire resulting MR signals for processing.

The coils of the scanner 12 are controlled by the scanner control circuitry 14 to generate the desired magnetic field and radiofrequency pulses. In the diagrammatical view of FIG. 1, the control circuitry 14 thus includes a control circuit 36 for commanding the pulse sequences employed during the examinations, and for processing received signals. The control circuit 36 may include any suitable programmable logic device, such as a CPU or digital signal processor of a general purpose or application-specific computer. Further, the control circuit 36 may include memory circuitry 38, such as volatile and/or non-volatile memory devices for storing physical and logical axis configuration parameters, examination pulse sequence descriptions, acquired image data, programming routines, and so forth, used during the examination sequences implemented by the scanner 12.

Interface between the control circuit 36 and the coils of the scanner 12 may be managed by amplification and control circuitry 40 and by transmission and receive interface circuitry 42. The amplification and control circuitry 40 includes amplifiers for each gradient field coil 26, 28, and 30 to supply drive current in response to control signals from the control circuit 36. The receive interface circuitry 42 includes additional amplification circuitry for driving the RF coil 32. Moreover, where the RF coil 32 serves both to emit the RF excitation pulses and to receive MR signals, the receive interface circuitry 42 may include a switching device for toggling the RF coil between active or transmitting mode, and passive or receiving mode. A power supply, denoted generally by reference numeral 34 in FIG. 1, is provided for energizing the primary magnet 24. Finally, the scanner control circuitry 14 includes interface components 44 for exchanging configuration and image data with the system control circuitry 16.

The system control circuitry 16 may include a wide range of devices for facilitating interface between an operator or radiologist and the scanner 12 via the scanner control circuitry 14. In the illustrated embodiment, for example, an operator workstation 46 is provided in the form of a computer workstation employing a general purpose or application-specific computer. The operator workstation 46 also typically includes memory circuitry for storing examination pulse sequence descriptions, examination protocols, user and patient data, image data, both raw and processed, and so forth. The operator workstation 46 may further include various interface and peripheral drivers for receiving and exchanging data with local and remote devices. In the illustrated embodiment, such devices include a monitor 48, a conventional computer keyboard 50, and an alternative input device such as a mouse 52. A printer 54 is provided for generating hard copy output of documents and images reconstructed from the acquired data. In addition, the system 10 may include various local and remote image access and examination control devices, represented generally by reference numeral 56 in FIG. 1. Such devices may include picture archiving and communication systems, teleradiology systems, and the like.

Figure 2:
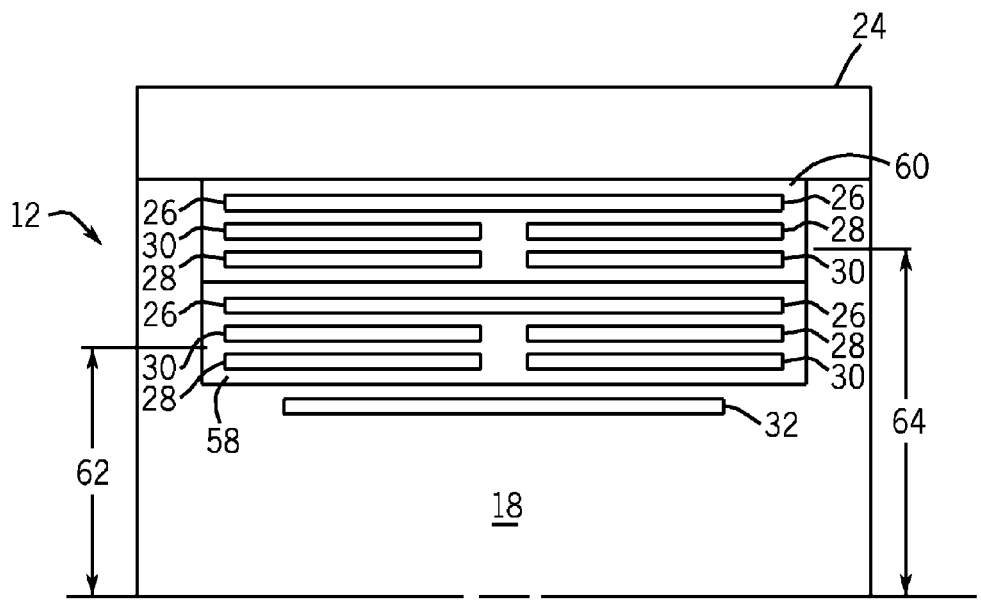
FIG. 2 is a cross-sectional view of a scanner of the MRI system of FIG. 1.

FIG. 2 illustrates a cross-sectional view of the scanner 12, particularly employing interleaved gradient coils 28 and 30 in accordance with one embodiment. In the cross-sectional view of FIG. 2, inner and outer gradient coil sets 58 and 60 are disposed radially around the inner volume 18 and between the main magnet 24 and the RF coil 32. The inner gradient coil set 58 and the outer gradient coil set 60 each includes the z-gradient coil 26, x-gradient coil 28, and y-gradient coil 30.

Because the scanner 12 employs interleaved gradient coils, a portion of the x-gradient coil 28 may be located above a portion of the y-gradient coil 30 on one side of each gradient coil set 58 or 60, while a portion of the x-gradient coil 28 may be located below a portion of the y-gradient coil 30 on the other. As such, a mean radial distance from the center of the inner volume 18 for the x-gradient coil 28 and the y-gradient coil 30 for each gradient coil set 58 or 60 may be effectively the same. Thus, the x-gradient coil 28 and y-gradient coil 30 of the inner gradient coil set 58 may have an effective radial distance 62 from the center of the inner volume 18. Similarly, the x-gradient coil 28 and y-gradient coil 30 of the outer gradient coil set 60 may have an effective radial distance 64 from the center of the inner volume 18.

Figure 3:
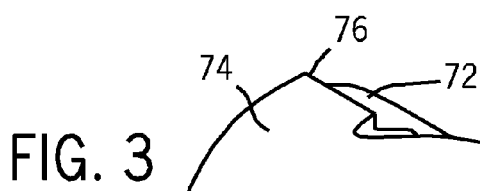
FIG. 3 is a three-dimensional schematic view of half of an interleaved figure-eight gradient coil in accordance with aspects of the present invention.

FIG. 3 illustrates an interleaved figure-eight gradient coil 66, which may be, for example, the x-gradient coil 28 or the y-gradient coil 30. The interleaved figure-eight gradient coil 66 may generally be wound in the shape of a figure-eight having a first underlying portion 68, a first overlying portion 70, a second underlying portion 72, and a second overlying portion 74. Each overlying portion 70 and 74 may be at the same outer radial distance and each underlying portion 68 and 72 may be at the same inner radial distance from the center of the inner volume 18. Steps 76 and 78 may connect overlying and underlying portions of each lobe of the interleaved figure-eight gradient coil 66, which may represent bends in the coils in a transverse direction toward or away from the inner volume 18, as shown. As will be described below, when a plurality of interleaved figure-eight gradient coils 66 are fitted together, the second overlying portion 74 of one coil 66 may cover the second underlying portion 72 of another coil 66. Similarly, the first underlying portion 68 of the one coil 66 may be covered by the first overlying portion 70 by the other coil 66. Such a configuration is described in greater detail below with reference to FIG. 5.

Figure 4:
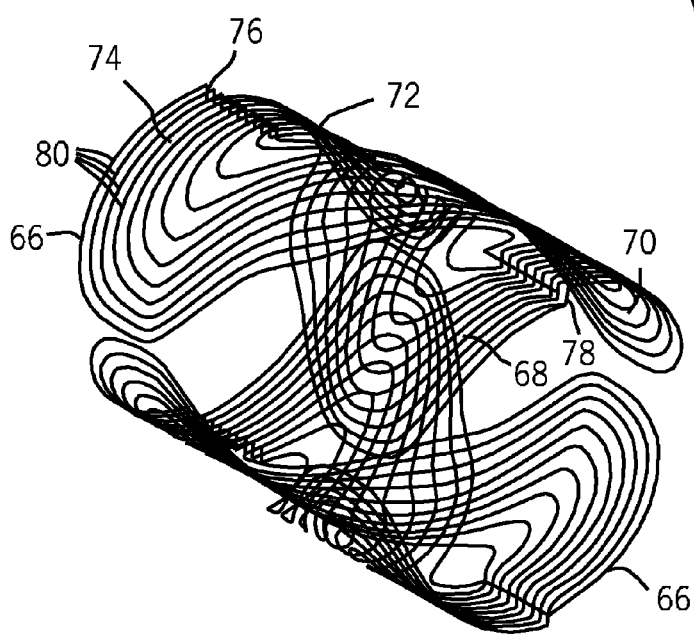
FIG. 4 is a three-dimensional view of a gradient coil formed from two of the interleaved figure-eight gradient coil halves of FIG. 3.

FIG. 4 illustrates a three-dimensional view of an x-gradient coil 28 or a y-gradient coil 30 formed from two of the interleaved figure-eight gradient coils 66 disposed diametrically opposite to one another. As illustrated in FIG. 4, each interleaved figure-eight gradient coil 66 may include a plurality of figure-eight coil conductors 80. The coil conductors 80 may be formed of any conductive material (e.g., copper), and may be solid or hollow. If the conductors 80 are hollow, a liquid coolant may be circulated through the conductors 80, as described further below. The figure-eight coil conductors are wrapped as shown in FIG. 4, creating the various portions 68-74.

Figure 5:
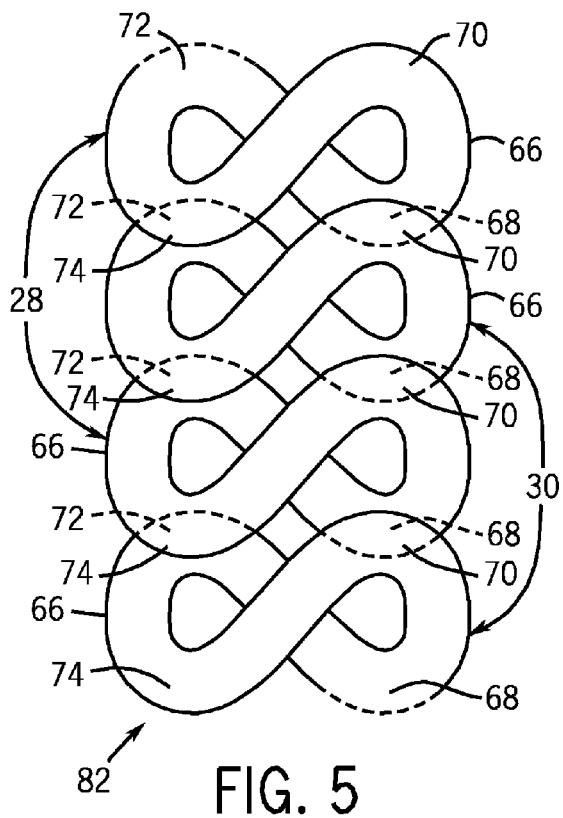
FIG. 5 a schematic of a configuration for interleaving x- and y-gradient coils each formed from the gradient coil of FIG. 4.

FIG. 5 is a schematic view of a configuration interleaving x- and y-gradient coils 28 and 30 have the same effective radial distance using four interleaved figure-eight gradient coils 66. Of the four interleaved figure-eight gradient coils 66 shown in FIG. 5, the first and third may form the x-gradient coil 28, while the second and fourth may form the y-gradient coil 30. The coils 66 of the x-gradient coil 28 may interleave with the coils 66 of the y-gradient coil 30 in the manner depicted. Thus, the first underlying portion 68 of each coil 66 may fit beneath the first overlying portion 70 of an adjacent coil, while the second overlying portion 74 may fit over the second underlying portion 72 of the adjacent coil.

Figure 8:
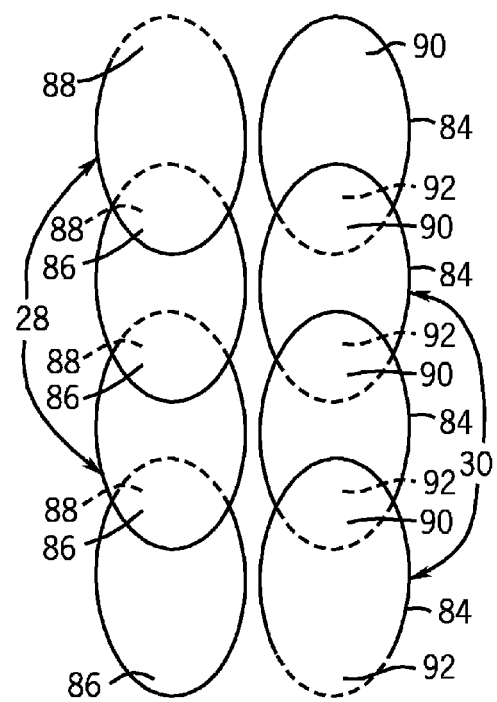
FIG. 8 a schematic of a configuration for interleaving x- and y-gradient coils each formed from the gradient coil of FIG. 7.
Figure 6:
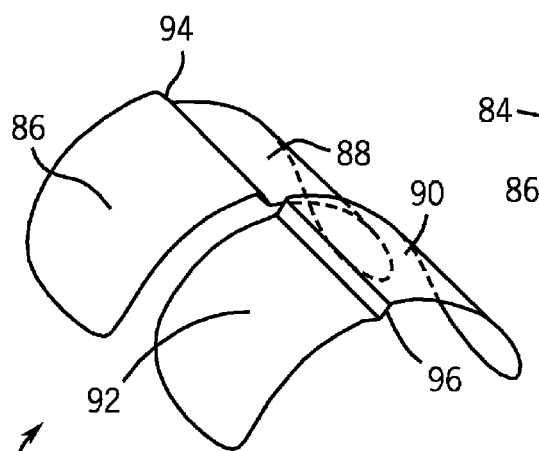
FIG. 6 is a three-dimensional schematic view of half of an interleaved gradient coil in accordance with aspects of the present invention.
Figure 7:
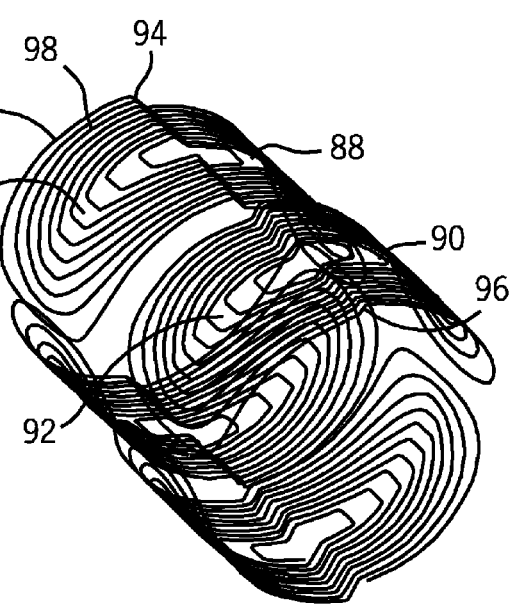
FIG. 7 is a three-dimensional view of a gradient coil formed from two of the interleaved gradient coil halves of FIG. 6.

FIGS. 6-8 illustrate interleaved gradient coils for use in the scanner 12. Turning first to FIG. 6, an interleaved Golay gradient coil 84 having a concentric coil arrangement of two distinct lobes per coil half may be interleaved in a manner similar to the interleaved figure-eight gradient coil 66 of FIG. 3. As such, the interleaved Golay gradient coil 84 may include a first overlying portion 86, a first underlying portion 88, a second overlying portion 90, and a second underlying portion 92. Each overlying portion 86 and 90 may be at the same outer radial distance and each underlying portion 88 and 92 may be at the same inner radial distance from the center of the inner volume 18. Steps 94 and 96 may connect overlying and underlying portions of each side of the interleaved Golay gradient coil 84, which may represent bends in the coils in a transverse direction toward or away from the inner volume 18, as shown. It should be appreciated that a plurality of interleaved gradient coils 84 may be fitted together. For example, the first overlying portion 86 of one coil 84 may cover the first underlying portion 88 of an adjacent coil 84, while the second underlying portion 92 of the one coil 84 may be covered by the second overlying portion 90 of the adjacent coil.

FIG. 7 illustrates a three-dimensional view of an x-gradient coil 28 or a y-gradient coil 30 formed from two interleaved gradient coils 84 disposed diametrically opposite to one another. As illustrated in FIG. 7, each interleaved Golay gradient coil 84 may include a plurality of coil conductors 98 arranged in concentric coil windings. The coil conductors 98 may be formed of any conductive material (e.g., copper), and may be solid or hollow. If the conductors 98 are hollow, a liquid coolant may be circulated through the conductors 98. The coil conductors 98 may be wrapped as shown in FIG. 7 to form the Golay gradient coil 84.

FIG. 8 is a schematic view of a configuration for interleaving x- and y-gradient coils 28 and 30 that may be formed from interleaved gradient coils 84. Of the four interleaved gradient coils 84 shown in FIG. 8, the first and third may form the x-gradient coil 28, while the second and fourth may form the y-gradient coil 30. The coils 84 of the x-gradient coil 28 may interleave with the coils 84 of the y-gradient coil 30 in the manner depicted. Thus, the first underlying portion 88 of each coil 84 may fit beneath an adjacent first overlying portion 86, while the second overlying portion 90 may fit over the adjacent second underlying portion 92.

Figure 9:
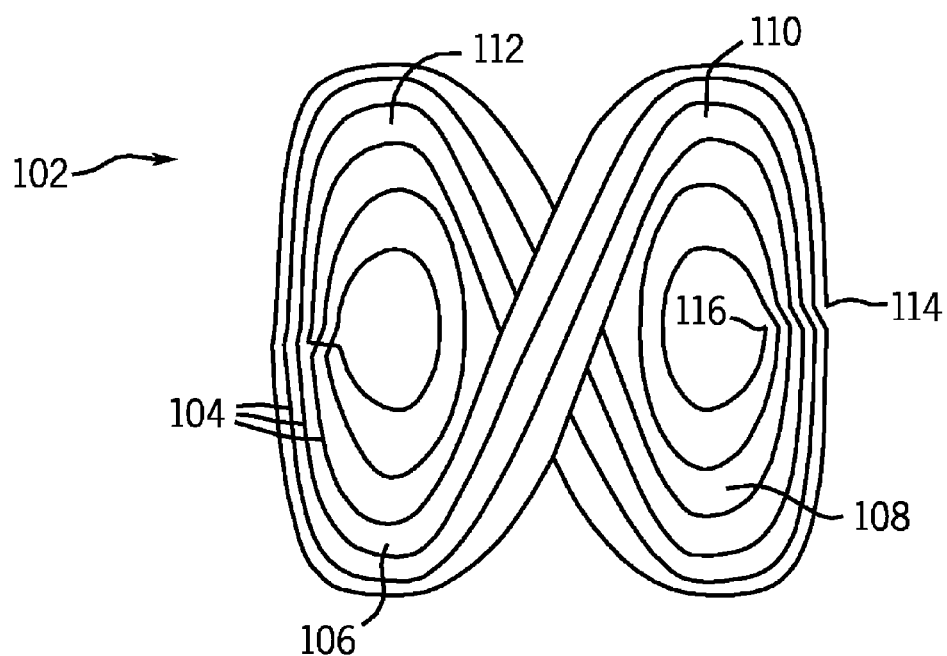
FIG. 9 is schematic of half of a hybrid interleaved gradient coil in accordance with aspects of the present invention.
Figure 10:
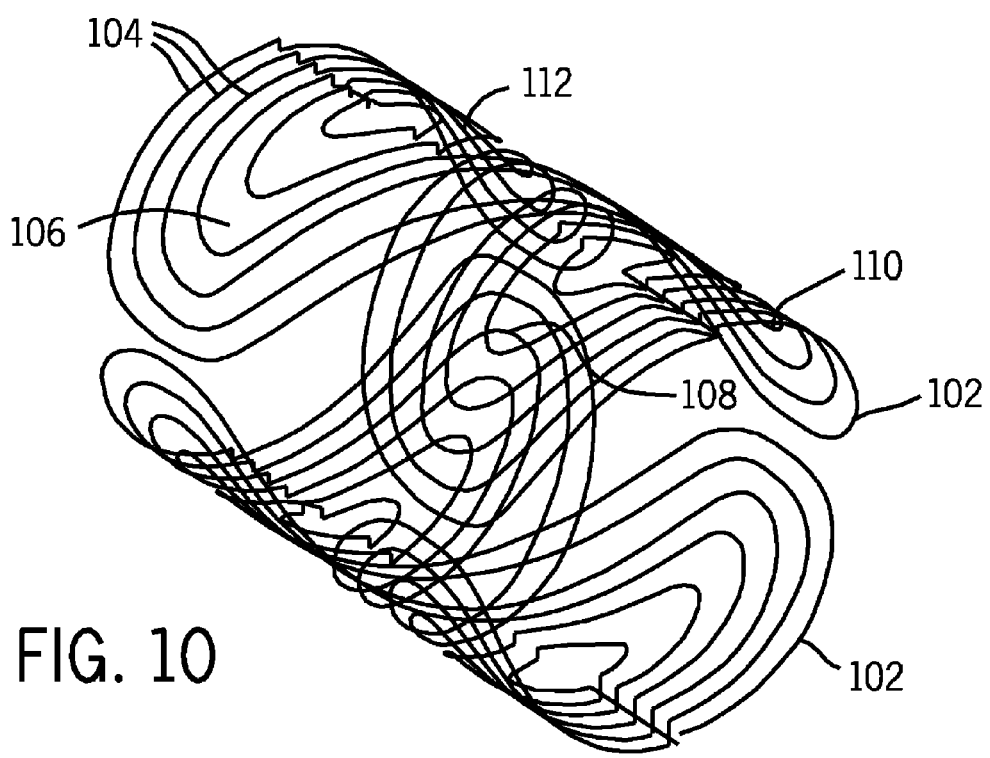
FIG. 10 is a three-dimensional view of a hybrid interleaved gradient coil formed from two of the hybrid interleaved gradient coil halves of FIG. 9.

FIGS. 9 and 10 describe a hybrid gradient coil 102 having elements of the interleaved figure-eight gradient coil 66 and the interleaved Golay gradient coil 84. Turning to FIG. 9, the interleaved hybrid gradient coil 102 may include a plurality of coil conductors 104 formed in the shape generally depicted therein. The coil conductors 104 may be formed of any conductive material (e.g., copper), and may be solid or hollow. If the conductors 104 are hollow, a liquid coolant may be circulated through the conductors 104. The coil conductors 104 may be wrapped as shown in FIG. 9 and FIG. 10, having some turns in the manner of the figure-eight gradient coil 66 and some turns in the manner of the Golay gradient coil 84. Due to the shape of the conductors 104 near its equator, the hybrid gradient coil 102 may be more efficient than a conventional Golay coil.

The hybrid gradient coil 102 may be configured to be interleaved in a manner similar to the interleaved figure-eight gradient coil 66 and the interleaved Golay Golay gradient coil 84. As such, the hybrid gradient coil 102 may include a first overlying portion 106, a first underlying portion 108, a second overlying portion 110, and a second underlying portion 112. Each overlying portion 106 and 110 may be at the same outer radial distance and each underlying portion 108 and 112 may be at the same inner radial distance from the center of the inner volume 18. It should be appreciated that a plurality of interleaved hybrid gradient coils 102 may be fitted together. For example, the first overlying portion 106 of one coil 84 may cover the second underlying portion 112 of an adjacent coil 102, while the first underlying portion 108 of the one coil 102 may be covered by the second overlying portion 110 of the adjacent coil. Such features may be more readily apparent as illustrated in FIG. 10, which represents a schematic view of an x-gradient coil 28 or a y-gradient coil 30 formed from two interleaved hybrid gradient coils 102 disposed diametrically opposite to one another.

Figure 11:
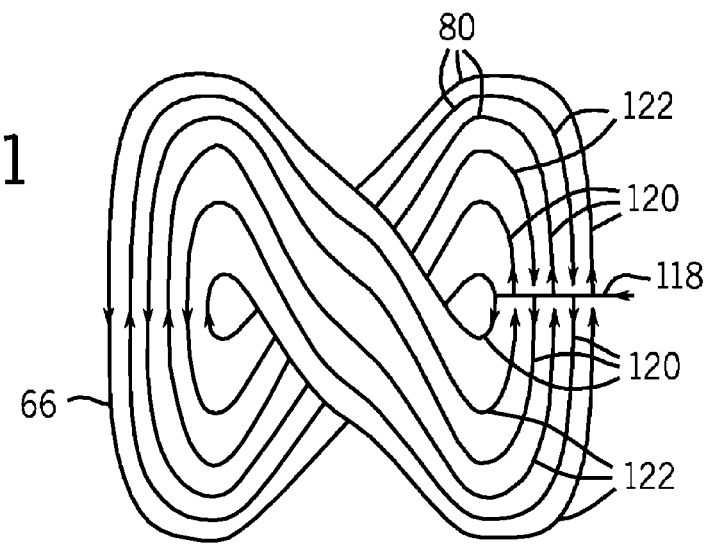
FIG. 11 is a schematic illustrating a manner of distributing coolant in a figure-eight gradient coil in accordance with aspects of the present invention.

FIG. 11 illustrates a manner of employing the figure-eight gradient coil 66 to evenly distribute coolant throughout the figure-eight coil conductors 80. The interleaved figure-eight gradient coil 66 may include an inlet 118 that may supply a coolant to various inflow turns 120, which may include, for example, water with corrosion inhibitors. To evenly apply the coolant throughout the coil 66, the inflow turns 120 may be alternatingly located between outflow turns 122, which may return the coolant in a heated state to an outlet that may be located behind the inlet 118, from which heat may be extracted before the coolant is recycled through the coil 66. Both the inlet 118 and the outlet may terminate at a service end of the scanner 12.

It should be noted that outer turns of the coil conductors 80 on one side of the interleaved figure-eight gradient coil 66 are connected to the inner turns of the other side. As such, each figure-eight coil conductor 80 may have approximately the same length. Accordingly, each cycle of coil conductors 80 from the inlet 118 to the outlet behind the inlet 118 may relatively evenly relieve heat dissipated by the figure-eight gradient coil 66. Additionally, the configuration of FIG. 11 may further enable a parallel electrical connection.

Figure 12:
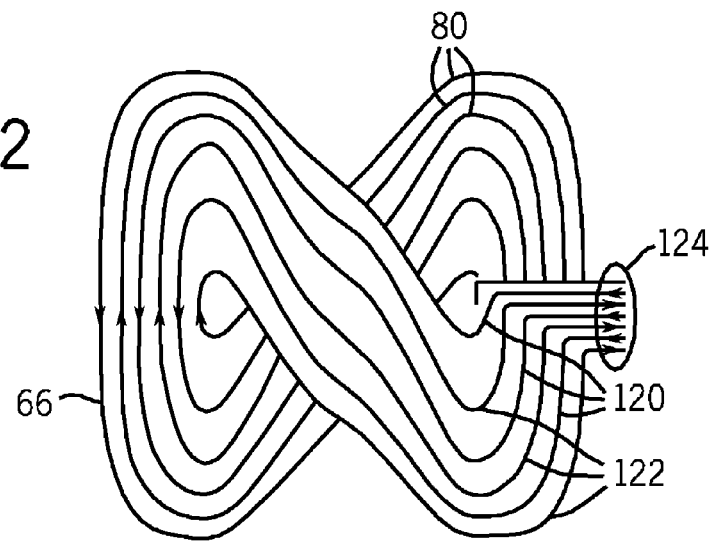
FIG. 12 is a schematic illustrating another manner of distributing coolant in a figure-eight gradient coil in accordance with aspects of the present invention.

FIG. 12 illustrates another manner of employing the figure-eight gradient coil 66 to distribute coolant throughout the figure-eight coil conductors 80. The interleaved figure-eight gradient coil 66 may include a terminal 124, through which coolant may flow via various inflow turns 120 and outflow turns 122. A complementary terminal behind the terminal 124 may similarly supply and receive coolant from the conductors 80.

Outer turns of the coil conductors 80 on one side of the interleaved figure-eight gradient coil 66 may be connected to the inner turns of the other side. As such, despite additional bends of the conductors 80, each figure-eight coil conductor 80 may have a very similar length. Accordingly, each cycle of coil conductors 80 from the terminal 124 to the complementary terminal may relatively evenly relieve heat dissipated by the figure-eight gradient coil 66. In a manner not unlike the configuration of FIG. 11, the configuration of FIG. 12 may further enable a parallel electrical connection. The terminal 124 and the complementary terminal may serve as an electrical input and output, providing a signal to the figure-eight gradient coil 66.

Figure 13:
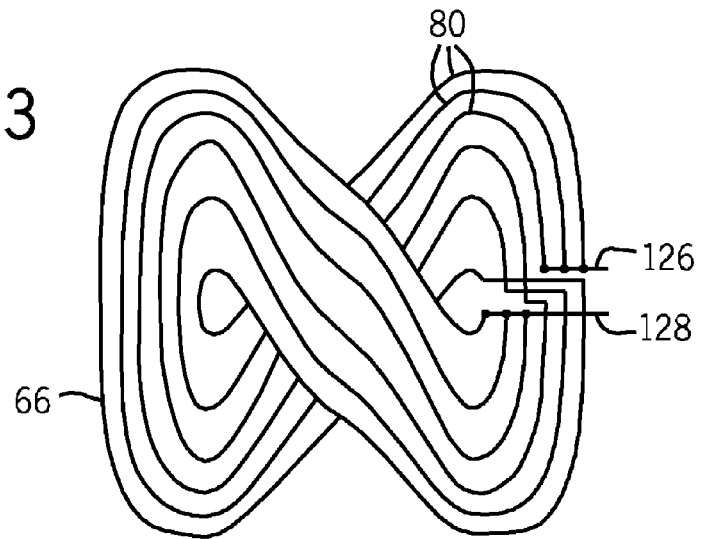
FIG. 13 is a schematic of an electrical configuration for a figure-eight gradient coil in accordance with aspects of the present invention.

FIG. 13 depicts a configuration for parallel electrical connection of the figure-eight gradient coil 66. As shown in FIG. 13, a manner of parallel connection may include an electrical input 126 and an electrical output 128. While FIG. 13 illustrates a connection to three of the six cycles of coil conductors 80, the electrical input 126 and output 128 may electrically connect any number of conductors. For example, the electrical input 126 and output 128 may alternatively connect all six cycles at the upper and lower portions of the rightmost lobe.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

The invention claimed is:

1. A gradient coil for a magnetic resonance imaging system comprising:
    a plurality of turns positioned such that the gradient coil is generally shaped as a figure-eight comprising a first turn disposed on an outer periphery of one lobe of the figure-eight and on an inner periphery of the other lobe of the figure-eight, wherein subsequent turns are disposed progressively towards an inner periphery of the one lobe and progressively towards an outer periphery of the other lobe.

2. The coil of claim 1, wherein the figure-eight forms a first section configured to overly a section of a first adjacent coil, a second section configured to underly another section of the first adjacent coil, a third section configured to overly a section of a second adjacent coil, and a fourth section configured to underly another section of the second adjacent coil.

3. The coil of claim 1, wherein all turns extend from one lobe of the figure-eight to the other lobe of the figure-eight.

4. The coil of claim 1, wherein at least one turn is formed only in one lobe of the figure-eight and at least one additional turn is formed only in the other lobe of the figure-eight.

5. The coil of claim 1, wherein the turns are formed of a hollow conductor capable of routing coolant through the coil.

6. The coil of claim 1, wherein each turn has approximately the same length.

7. A gradient coil for a magnetic resonance imaging system comprising:
    four coils, each coil having a plurality of turns formed generally in a figure-eight;
    wherein the coils are interleaved in a generally cylindrical configuration with a first section of each coil overlying a corresponding underlying section of a preceding coil and a second section underlying a corresponding overlying section of the preceding coil.

8. The coil of claim 7, wherein first diametrically opposed coils form an X coil of a gradient coil system, and second diametrically opposed coils form a Y coil of a gradient coil system.

9. The coil of claim 8, wherein the X coil and the Y coil have the same effective radial distance from a center of an imaging volume when installed into a magnetic resonance system scanner.

10. The coil of claim 7, wherein the plurality of turns of the four coils comprises a plurality of hollow conductors configured to hold coolant for cooling the coils.

11. The coil of claim 7, wherein each of the plurality of turns is approximately the same length.

12. A gradient coil for a magnetic resonance imaging system comprising:

first and second X coils disposed at diametrically opposite locations in a generally cylindrical configuration; and first and second Y coils disposed at diametrically opposite locations in the generally cylindrical configuration and displaced at 90 degrees with respect to the X coils;

wherein the coils are interleaved with an overlying section of each X coil overlying a corresponding underlying section of each adjacent Y coil and an underlying section of each X coil underlying a corresponding overlying section of each adjacent Y coil.

13. The gradient coil of claim 12, wherein the X and Y coils have the same effective radial distance from a center of an imaging volume when installed into a magnetic resonance system scanner.

14. The gradient coil of claim 12, wherein each coil is wound as a Golay coil.

15. The gradient coil of claim 12, wherein each coil is wound to form a figure-eight.

16. The gradient coil of claim 12, wherein each coil is wound to form a figure-eight with at least one central winding of each lobe of the figure-eight forming a loop on the same lobe of the figure-eight.

17. The gradient coil of claim 12, wherein each coil is wound with successive turns such that each turn is approximately the same length.

18. The gradient coil of claim 12, wherein each coil is wound such that a plurality of adjacent turns are electrically connected in parallel to control circuitry.

\* \* \* \* \*